United States Patent
Cheung et al.

(10) Patent No.: US 7,182,118 B2
(45) Date of Patent: Feb. 27, 2007

(54) PICK AND PLACE ASSEMBLY FOR TRANSPORTING A FILM OF MATERIAL

(75) Inventors: Yiu Ming Cheung, Hong Kong (HK); Chi Ming Chong, Hong Kong (HK)

(73) Assignee: ASM Assembly Automation Ltd., Hong Kong (HK)

( * ) Notice: Subject to any disclaimer, the term of this patent is extended or adjusted under 35 U.S.C. 154(b) by 0 days.

(21) Appl. No.: 10/452,993

(22) Filed: Jun. 2, 2003

(65) Prior Publication Data

US 2004/0238112 A1 Dec. 2, 2004

(51) Int. Cl.
*B29C 65/78* (2006.01)

(52) U.S. Cl. .................. 156/556; 156/542; 156/581; 156/285; 156/286; 156/295; 100/211

(58) Field of Classification Search ........ 156/285–286, 156/295, 542, 556, 566, 583.1, 571, DIG. 37, 156/DIG. 42, DIG. 41, 581; 369/286; 100/211; 29/743; *G11B 7/24, 7/26*
See application file for complete search history.

(56) References Cited

U.S. PATENT DOCUMENTS

| | | | |
|---|---|---|---|
| 4,981,546 A * | 1/1991 | Bergevin | 156/515 |
| 5,092,954 A * | 3/1992 | Braun et al. | 156/540 |
| 5,458,729 A * | 10/1995 | Galchefski et al. | 156/566 |
| 5,733,410 A * | 3/1998 | Gore et al. | 156/556 |
| 6,248,441 B1 * | 6/2001 | Anderson et al. | 428/346 |
| 2002/0109217 A1 | 8/2002 | Nam et al. | |
| 2003/0115747 A1 * | 6/2003 | Schnetzler et al. | 29/830 |

FOREIGN PATENT DOCUMENTS

| JP | 2-95633 | * 4/1990 |
|---|---|---|
| JP | 6-104300 | 4/1994 |
| JP | 7-66092 | 3/1995 |
| JP | 2001-118863 | 4/2001 |
| JP | 2001-334891 | 11/2002 |

* cited by examiner

*Primary Examiner*—Jessica Rossi
(74) *Attorney, Agent, or Firm*—Ostrolenk, Faber, Gerb & Soffen, LLP

(57) ABSTRACT

The invention provides a pick and place assembly for transferring a film of material. The assembly comprises a collet having a substantially convex contact surface for contacting the film, the collet including a vacuum suction device operative to generate a force to hold the film. The film may comprise a thermoplastic adhesive tape or B-stage thermoset epoxy coated film.

12 Claims, 2 Drawing Sheets

PICK AND PLACE ASSEMBLY FOR TRANSPORTING A FILM OF MATERIAL

FIELD OF THE INVENTION

The invention relates to a pick and place assembly to pick up and to apply films of material, in particular but not limited to a thermoplastic adhesive film, to an electronic component.

BACKGROUND AND PRIOR ART

Pick and place tools, which may be in the form of vacuum collets or suction heads, are used in automated semiconductor manufacturing processes to transfer electronic components or materials from one location to another. One such application of a pick and place tool is in the transfer of semiconductor dice from a cut semiconductor wafer to a bond pad of a substrate during a packaging process.

Typically, an adhesive material is placed onto the substrate for bonding the semiconductor die to the bond pad. The adhesive material may be in liquid form, such as epoxy, or in tape form, such as a polyimide tape, as disclosed in US Patent Publication number 2002/0109217 in respect of an "Apparatus for Die Bonding". An advantage of using adhesive tape is that it is electrically insulating and it does not overspread on the bond pad during attachment of a die onto it. Overspreading may lead to defects during later processing of the component.

Another application of adhesive material is in the fabrication of a stacked die CSP ("Chip-Scale Package"). Stacked die CSPs serve to increase the semiconductor die density of a semiconductor package by including two or more semiconductor dice in one package. A high density package, having multiple semiconductor dice therein, increases the electronic component density on a printed circuit board. Such a high density semiconductor package also maximizes space utilization on a printed circuit board and further increases the number of active elements on the printed circuit board. Liquid adhesive is not desirable as an adhesive material for stacking the dice due to the aforesaid problem of overspreading, and adhesive tape or film is generally preferred. Therefore, the application of thin adhesive films or thermoplastic adhesive films is one of the major processes involved in the assembly and packaging of semiconductor devices, especially those involving stacked die CSPs.

Pick and place tools usually consist of flat or recessed vacuum collets or suction heads. Hard materials or materials with some resilience like rubber are used in contact surfaces for these suction heads for compliance with the surface of a material picked. When such pick and place tools are used to pick a thin thermoplastic adhesive film and to place it onto a flat heated substrate for bonding, air bubbles may be trapped and form voids between the interface of the adhesive film and the substrate and/or die. Even if the surface of a pick and place tool is perfectly flat, these voids may be unavoidable. Amongst other things, this is due to the flexible nature of the film material and difficulty in tensioning the film since the film is held by vacuum suction only. As a result, such voids may cause defects in the fabrication of semiconductor devices.

SUMMARY OF THE INVENTION

It is an object of the invention to provide a pick and place tool that avoids some of the aforesaid disadvantages when transferring films of material from a pick location to a place location.

Accordingly, the invention provides a pick and place assembly for transferring a film of material comprising a collet having a substantially convex contact surface for contacting the film, the collet including a vacuum suction device operative to generate a force to hold the film.

It will be convenient to hereinafter describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

An example of a preferred embodiment of a pick and place tool in accordance with the invention will now be described with reference to the accompanying drawings, in which.

DETAILED DESCRIPTION OF THE PREFERRED EMBODIMENT OF THE INVENTION

Figure 1:
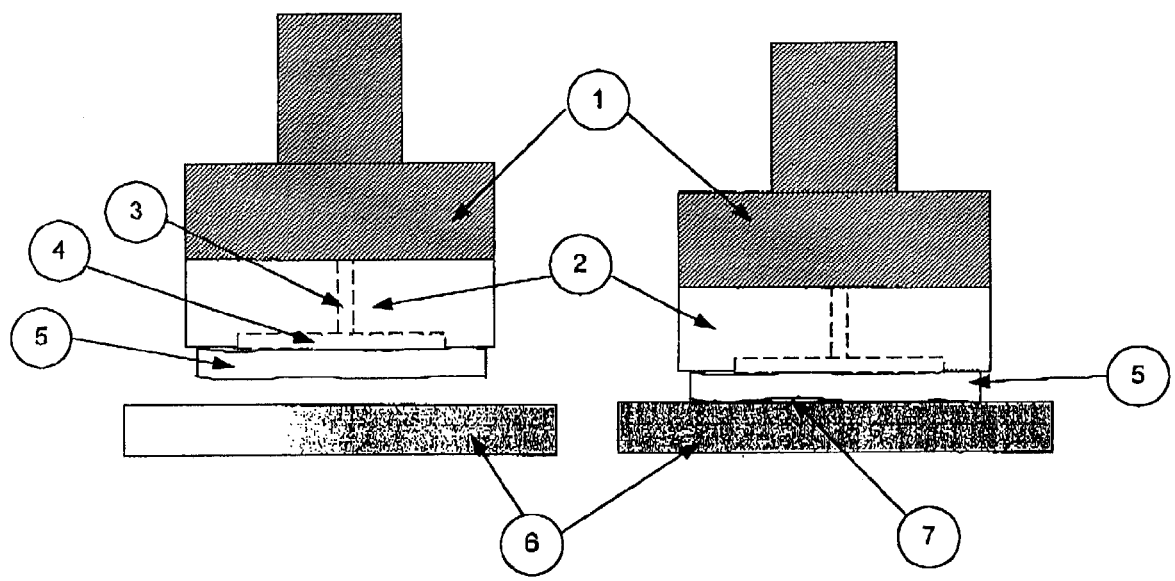
FIG. 1(a) is a sectional view of a prior art pick and place tool holding a thin adhesive film over a flat placement surface of a substrate.
FIG. 1(b) is a sectional view of the prior art pick and place tool placing the thin adhesive film onto the flat placement surface of the substrate.

FIG. 1(a) is a sectional view of a prior art pick and place assembly or tool holding a thin adhesive film 5 over a flat surface of a substrate 6. The pick and place tool generally comprises a collet or pickhead holder 1 and a suction head or vacuum collet 2. Inside the vacuum collet 2, there is a vacuum channel 3 for providing suction force to hold the adhesive film 5. Sometimes, there may be a recess 4 at the opening of the vacuum channel 3 to enhance the effectiveness of the suction force. In an adhesive film application process, the thin adhesive film 5, which may be in the form of a thermoplastic adhesive film, is held by the pick and place tool by suction means and vacuum suction is supplied through the vacuum channel 3 inside the collet 2.

FIG. 1(b) is a sectional view of the prior art pick and place tool placing the thin adhesive film 5 onto the flat surface of the substrate 6. The adhesive film 5 is pasted onto the substate 6 and a compressive force is applied vertically downwards from the tool onto the adhesive film 5. This force should be high enough such that the pressure-sensitive adhesive film 5 can adhere onto the substrate 6. If a thermoplastic adhesive film or B-stage thermoset epoxy coated film is used, the substrate 6 needs to be heated to a temperature higher than a glass transitional temperature, Tg, of the thermoplastic adhesive film 5 and the curing temperature of the thermoset epoxy, respectively. For electronic packaging processes, these temperatures should be less than the Tg of the substrate, usually BT resin, which is at approximately 180° C.

In the case of a very thin and flexible film, the recess 4 in the collet 2 is not desirable since it may contribute to the formation of voids 7. This is because air bubbles will be trapped inside the film 5 when the film (which is not totally flat) adheres onto the substrate 6 with a flat surface. These voids 7 are undesirable and will affect the reliability of the final product. Even a perfectly flat collet 2 without recess 4 cannot avoid the formation of these voids 7 along the adhesion interface since there is no way to apply pre-tension to the film 5 to flatten it, since the film 5 is being held by vacuum suction only. To address this situation, a smaller opening for the vacuum channel 3 of the vacuum collet 2 can help to reduce the size of voids 7 that are created, but the solution can be further improved.

Figure 2:
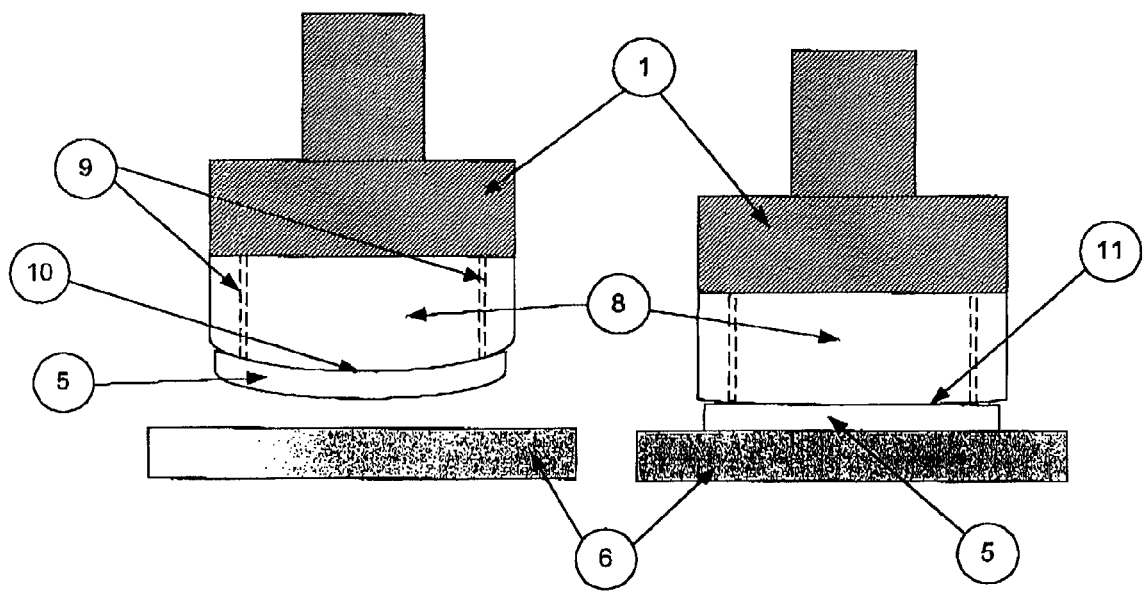
FIG. 2(a) is a sectional view of a pick and place tool according to the preferred embodiment of the invention holding a thin adhesive film over a flat placement surface of a substrate.
FIG. 2(b) is a sectional view of the said pick and place tool according to the preferred embodiment placing the thin adhesive film onto the flat placement surface of the substrate.

FIG. 2(a) is a sectional view of a pick and place assembly or tool according to the preferred embodiment of the invention holding a film of material, such as a thin adhesive film 5, over a flat placement surface of a substrate 6. In the preferred embodiment of this invention, the suction head or vacuum collet 8 has a convex curvature for its contact surface 10, and does not have a recess. The contact surface 10 will contact the adhesive film 5 during pickup.

The vacuum collet 8 of the pick and place tool is preferably deformable so as to be compliant with the placement surface of the substrate 6 during placement of the film 5. Hence, the vacuum collet preferably includes a resilient material, such as silicone-based rubber or a stainless steel foil with a soft backing support.

Three other requirements are preferred in the choice of material to form the vacuum collet 8. One is that the material should be able to withstand temperatures of up to 200° C. so that it works properly at the Tg of thermoplastic film (which is at approximately 150–180° C.). The second requirement is that the contact surface should be of a type that an adhesive film 5 that it is holding does not tend to cling to it, especially under pressure and elevated temperature, to aid in removal of the pick and place tool after placement. The third requirement is that the hardness of the resilient material or the soft backing support should be in the range of 35–55 in Durometer, Shore "A" points at room temperature.

A plurality of vacuum channels 9 having openings on the contact surface 10 are preferably distributed close to the corners of the vacuum collet 8 and none at the center of the collet 8. Thus, for a substantially square-shaped collet, there are preferably four vacuum channels 9, each located near a corner of the collet 8. Small openings (preferably less than 0.5 mm in width) are used for the vacuum channels 9. When the adhesive film 5 is contacted by the pick and place tool and vacuum suction is turned on, the film 5 will tend to conform to the convex contact surface 10 as shown in FIG. 2(a).

FIG. 2(b) is a sectional view of the said pick and place tool according to the preferred embodiment placing the thin adhesive film 6 onto the flat surface of the substrate 6. The illustration shows that the adhesive film 5 will be flattened when a vertical downward compressive force is applied from the pick and place tool (comprising the holder 1 and vacuum collet 8) to push the adhesive film 5 against the flat surface of the substrate 6 (at an elevated temperature if necessary).

During placement, the center portion of the convex contact surface 10 of the suction head or vacuum collet 8, as well as the corresponding portion of the adhesive film 5 adjacent to it, will contact the placement surface of the substrate 6 first. Then, since this convex contact surface 10 is made of resilient material, it will be deformed and flattened by the compressive force as the holder 1 moves downwards. In this way, any voids or air bubbles occurring between the adhesive film 5 and the surface of the substrate 6 will be gradually squeezed out of the film 5 outwards from the said portion of the film 5. A void-free attachment interface 11 between the adhesive film 5 and the substrate 6 may thereby be formed.

Therefore, it would be appreciated that the resilient convex profile of the suction head or vacuum collet 8 used as aforesaid for the application of thin thermoplastic adhesive films 5 can assist in providing void-fee attachment of these films 5 onto the flat surfaces of substrates 6 at elevated temperatures.

The invention described herein is susceptible to variations, modifications and/or additions other than those specifically described and it is to be understood that the invention includes all such variations, modifications and/or additions which fall within the spirit and scope of the above description.

The invention claimed is:

1. A pick and place assembly for transferring a film of material comprising:
a collet having a substantially convex contact surface for contacting the film;
the collet including a vacuum suction device operative to generate a force to hold the film, wherein the vacuum suction device includes vacuum outlets through the contact surface that are located only close to corners of the collet, and are absent at all other locations.

2. A pick and place assembly as claimed in claim 1, wherein the width of each outlet is less than 0.5 mm.

3. A pick and place assembly as claimed in claim 1, wherein the collet has four vacuum outlets, each located close to a corner of the collet.

4. A pick and place assembly as claimed in claim 3, wherein the width of each outlet is less than 0.5 mm.

5. A pick and place assembly as claimed in claim 1, wherein the contact surface is deformable by a placement surface upon contact therewith during placement of the film.

6. A pick and place assembly as claimed in claim 5, wherein a center of the convex contact surface and a corresponding portion of the film adjacent to it are operative to contact a placement surface first during placement of the film, whereby to squeeze any voids between an interface of the film and placement surface outwards from said portion of the film.

7. A pick and place assembly as claimed in claim 5, wherein the contact surface includes a resilient material.

8. A pick and place assembly as claimed in claim 7, wherein the resilient material is capable of withstanding temperatures of up to 200° C.

9. A pick and place assembly as claimed in claim 7, wherein the contact surface comprises a material that an adhesive film it is holding does not tend to cling to.

10. A pick and place assembly as claimed in claim 7, wherein the hardness of the resilient material is in the range of 35–55 in Durometer, Shore "A" points at room temperature.

11. A pick and place assembly as claimed in claim 7, wherein the resilient material comprises a silicone-based rubber.

12. A pick and place assembly as claimed in claim 7, wherein the resilient material comprises a stainless steel foil with a soft backing support.

* * * * *